(12) United States Patent
Hwangbo

(10) Patent No.: US 11,184,973 B2
(45) Date of Patent: Nov. 23, 2021

(54) PRINTED CIRCUIT BOARD INCLUDING AUXILIARY POWER SUPPLY AND ELECTRONIC APPARATUS INCLUDING THE SAME

(71) Applicant: SAMSUNG ELECTRONICS CO., LTD., Suwon-si (KR)

(72) Inventor: Hoon Hwangbo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/941,854

(22) Filed: Jul. 29, 2020

(65) Prior Publication Data
US 2021/0045234 A1 Feb. 11, 2021

(30) Foreign Application Priority Data

Aug. 9, 2019 (KR) .......................... 10-2019-0097207

(51) Int. Cl.
*H05K 1/02* (2006.01)
*H01L 23/498* (2006.01)
*H05K 1/11* (2006.01)

(52) U.S. Cl.
CPC ..... *H05K 1/0231* (2013.01); *H01L 23/49838* (2013.01); *H05K 1/112* (2013.01); *H05K 2201/093* (2013.01)

(58) Field of Classification Search
CPC ... H05K 2201/093; H05K 2201/09309; H05K 1/0231; H05K 1/111–119; H05K 23/49833
See application file for complete search history.

(56) References Cited

U.S. PATENT DOCUMENTS 6,577,508 B1 6/2003 Kwong et al.
2009/0206951 A1* 8/2009 Nakamura ............. H05K 1/165
333/181

(Continued)

FOREIGN PATENT DOCUMENTS

JP 2006-245320 9/2006
JP 2007-335618 12/2007
JP 2009-10273 1/2009

OTHER PUBLICATIONS

International Search Report and Written Opinion of the International Searching Authority dated Nov. 17, 2020 in International Patent Application No. PCT/KR2020/009670.

*Primary Examiner* — Hoa C Nguyen
(74) *Attorney, Agent, or Firm* — Staas & Halsey, LLP

(57) ABSTRACT

Disclosed is a printed circuit board comprising: an integrated circuit (IC) mounted on a board plane; a power supply provided on the board plane and connected to an external power source to supply necessary power to the IC; a power plane provided in the board plane and configured to provide a main path for supplying the power from the power supply to the IC; a ground plane provided in the board plane and configured to provide a ground path corresponding to the power plane; a body mounted on the board plane by surface mount technology (SMT) and formed of an insulating material; and a conductive member disposed on the body and having one end connected to the power supply and another end connected to the IC to provide an additional power supply path in parallel with the power plane.

16 Claims, 20 Drawing Sheets

(56) References Cited

U.S. PATENT DOCUMENTS

| | | | |
|---|---|---|---|
| 2012/0326272 A1* | 12/2012 | Rokuhara | H01G 4/228 257/532 |
| 2014/0133115 A1* | 5/2014 | Iguchi | H05K 1/0243 361/760 |
| 2015/0237731 A1* | 8/2015 | Toyama | H05K 1/0231 361/760 |
| 2016/0309592 A1 | 10/2016 | Nagasato | |
| 2017/0048963 A1* | 2/2017 | Murakami | H05K 1/115 |
| 2017/0190158 A1* | 7/2017 | Ishikawa | B32B 27/08 |
| 2019/0088644 A1 | 3/2019 | Yang | |

* cited by examiner

PRINTED CIRCUIT BOARD INCLUDING AUXILIARY POWER SUPPLY AND ELECTRONIC APPARATUS INCLUDING THE SAME

CROSS-REFERENCE TO RELATED THE APPLICATION

This application is based on and claims priority under 35 U.S.C. § 119 to Korean Patent Application No. 10-2019-0097207 filed on Aug. 9, 2019 in the Korean Intellectual Property Office, the disclosure of which is incorporated by reference herein in its entirety.

BACKGROUND

Field

The disclosure relates to a printed circuit board (PCB) including an auxiliary power supply and an electronic apparatus including the same.

Description of the Related Art

Electronic apparatuses, such as a television (TV) or a mobile phone, include a printed circuit board (PCB). The PCB includes a power plane for supplying power to parts, such as an integrated circuit (IC), installed on a board plane and a ground plane corresponding to the power plane. The PCB generally includes a plurality of layers of conductor plates in a plastic panel which constitutes a body. One layer or two or more layers of the conductor plates are used as the power plane, and one layer or two or more layers other than the power plane are used as the ground plane.

FIG. 1 is a diagram schematically showing a configuration of a general PCB, FIG. 2 is a schematic circuit diagram of FIG. 1, and FIG. 3 is a cross-sectional view of a power plane of FIG. 1.

An IC 21 is installed on a PCB 10, and two layers of planes, that is, a power plane 11 and a ground plane 12, are embedded in the board plane of the PCB 10. An IC package 20 is installed on the PCB 10. The IC package 20 includes the IC 21. A virtual resource module (VRM) 30 is installed on a side of the PCB 10. The VRM 30 serves as a regulator which regulates a voltage supplied from an external power source (not shown) connected to the PCB 10. Electrical power from the external power source is regulated by the VRM 30 and then supplied to the IC 21 through the power plane 11.

Noise is included in a current supplied to the IC 21. To remove such noise, first and second capacitor elements 41 and 42 are provided in the PCB 10. The first capacitor element 41 is installed close to the VRM 30, and the second capacitor element 42 is installed close to the IC package 20. The first and second capacitor elements 41 and 42 connect the power plane 11 and the ground plane 12 together and remove noise components of the current supplied through the power plane 11 by diverting the noise components to the ground plane 12. The capacitor elements 41 and 42 are modeled into a resistor-inductor-capacitor (R-L-C) circuit as shown in FIG. 2 by considering physical characteristics thereof. To effectively remove noise which is an alternating component, the capacitor elements 41 and are configured with very high resistance values and capacitance values and very low inductance values.

In the IC package 20, a third capacitor element 43 is provided to remove noise components from a current supplied from the PCB 10 to the IC package 20. In the IC 21, a fourth capacitor element 44 is embedded to remove noise components from a current supplied to the IC 21 through the IC package 20. In this way, noise components of a current, which is supplied from the VRM 30 finally to the IC 21, are removed through several noise removal processes.

As functions of electronic apparatuses are complicated and size thereof is reduced, the degree of integration of parts installed in the PCB 10 is increased, whereas a reduction in power consumption is pursued. This requires a high current and a low operating voltage for the power supplied to the PCB 10. Due to such a trend, a voltage drop in the power plane 11, which provides a power supply path, and noise cause problems in normal operation of the IC 21.

For example, it is assumed that an operating power has a high current of 10 A and a low voltage of 1.2V. In the structure of the PCB 10 shown in FIG. 1, the single power plane 11 is configured to have, for example, a thickness of 0.035 mm and a width of 10 mm as shown in FIG. 3 so that a cross-sectional area is 0.35 mm$^2$. Due to such a small cross-sectional area, a resistance of the power plane 11 is increased, and thus a voltage drop in the power plane 11 is increased. For example, when the IC 21 is required to have a power ripple of ±5% in a supply voltage, a maximum width of allowed power ripples is 120 mV. When a high current is supplied, a voltage drop caused by the resistance of the power plane 11 is increased, and thus the voltage drop may exceed the allowed maximum width of 120 mV. Further, when the resistance of the power plane 11 is increased, inductance is also increased, and thus high frequency ripples become severe, which leads to an increase in noise.

To reduce the resistance of the power plane 11, the power plane 11 should be designed with a large cross-sectional area and a short length. However, due to limited physical size of the PCB 10, it is difficult to design the PCB 10 in order to sufficiently achieve such an effect. Also, there is a recent trend of arranging parts only on an upper side of the PCB 10 so as not to cause an increase in the thickness of the PCB 10. Accordingly, it is difficult to consider a method of mounting an additional noise reduction element, such as a capacitor, on a lower side of the PCB 10. Consequently, there is a limit in reducing noise.

SUMMARY

According to an example embodiment, a printed circuit board comprising: an integrated circuit (IC) mounted on a board plane; a power supply provided on the board plane and connected to an external power source to supply necessary power to the IC; a power plane provided in the board plane and configured to provide a main path for supplying the power from the power supply to the IC; a ground plane provided in the board plane and configured to provide a ground path corresponding to the power plane; a body mounted on the board plane by surface mount technology (SMT) and formed of an insulating material; and a conductive member disposed on the body and having one end connected to the power supply and another end connected to the IC to provide an additional power supply path in parallel with the power plane.

The printed circuit board may further comprise: first and second pads disposed on a first surface, which is a surface of the body in contact with the board plane, and electrically connected to each of the one end and the other end of the conductive member; and first and second contact points provided on the board plane, respectively being contacted with the first pad and the second pad while the body is mounted on the board plane, and respectively connected to the power supply and the IC.

The conductive member may be disposed on a second surface of the body which is different from the first surface, and via holes for electrically connecting each of the first and second pads to the conductive member may be formed in the body.

The printed circuit board may further comprise conductive pads provided in the second surface of the body and electrically connected to the first pad and the second pad through the via holes, wherein the conductive member may be disposed on the conductive pads.

An accommodation groove in which the conductive member is accommodated may be formed in the body, and the conductive pads may be provided on an internal surface of the accommodation groove.

The printed circuit board may further comprise a capacitor element disposed on the body and having one end connected to the conductive member and another end connected to the ground plane to divert noise components, which are included in the power supplied from the power supply to the IC, to the ground plane.

The printed circuit board may further comprise: a third pad disposed in a first surface, which is a surface of the body in contact with the board plane, and electrically connected to the capacitor element; and a third contact point provided on the board plane, being contacted with the third pad while the body is mounted on the board plane, and connected to the ground plane.

The capacitor element may be disposed on a second surface of the body which is different from the first surface, and a via hole for electrically connecting the third pad to the capacitor element may be formed in the body.

A plurality of capacitor elements identical to the capacitor element may be disposed in parallel.

According to an example embodiment, a printed circuit board comprising: an integrated circuit (IC) mounted on a board plane; a power supply provided on the board plane and connected to an external power source to supply necessary power to the IC; a power plane provided in the board plane and configured to provide a main path for supplying the power from the power supply to the IC; a ground plane provided in the board plane and configured to provide a ground path corresponding to the power plane; a body mounted on the board plane by surface mount technology (SMT) and formed of an insulating material; and a capacitor element disposed on the body and having one end connected to a power supply path between the power supply and the IC and another end connected to the ground plane to divert noise components, which are included in the power supplied from the power supply to the IC, to the ground plane.

The printed circuit board may further comprise: a third pad disposed in a first surface, which is a surface of the body in contact with the board plane, and electrically connected to the capacitor element; and a third contact point provided on the board plane, being contacted with the third pad while the body is mounted on the board plane, and connected to the ground plane.

The capacitor element may be disposed on a second surface of the body which is different from the first surface, and a via hole for electrically connecting the third pad to the capacitor element may be formed in the body.

A plurality of capacitor elements identical to the capacitor element may be disposed in parallel.

According to an example embodiment, an electronic apparatus comprising a printed circuit board, wherein the printed circuit board comprises: an integrated circuit (IC) mounted on a board plane; a power supply provided on the board plane and connected to an external power source to supply necessary power to the IC; a power plane provided in the board plane and configured to provide a main path for supplying the power from the power supply to the IC; a ground plane provided in the board plane and configured to provide a ground path corresponding to the power plane; a body mounted on the board plane by surface mount technology (SMT) and formed of an insulating material; and a conductive member disposed on the body and having one end connected to the power supply and another end connected to the IC to provide an additional power supply path in parallel with the power plane.

The printed circuit board may further comprise a capacitor element disposed on the body and having one end connected to the conductive member and another end connected to the ground plane to divert noise components, which are included in the power supplied from the power supply to the IC, to the ground plane.

According to an example embodiment, an electronic apparatus comprising a printed circuit board, wherein the printed circuit board comprises: an integrated circuit (IC) mounted on a board plane; a power supply provided on the board plane and connected to an external power source to supply necessary power to the IC; a power plane provided in the board plane and configured to provide a main path for supplying the power from the power supply to the IC; a ground plane provided in the board plane and configured to provide a ground path corresponding to the power plane; a body mounted on the board plane by surface mount technology (SMT) and formed of an insulating material; and a capacitor element disposed on the body and having one end connected to a power supply path between the power supply and the IC and another end connected to the ground plane to divert noise components, which are included in the power supplied from the power supply to the IC, to the ground plane.

BRIEF DESCRIPTION OF THE DRAWINGS

The above and/or the aspects will become apparent and more readily appreciated from the following description of exemplary embodiments, taken in conjunction with the accompanying drawings, in which.

DETAILED DESCRIPTION OF EXEMPLARY EMBODIMENTS

Hereinafter, various embodiments of the disclosure will be described in detail with reference to the drawings.

In the description of the disclosure, the term "electronic apparatus" refers to any type of device, such as a television (TV) or a mobile phone, in which a printed circuit board (PCB) is used. Also, in the description of the disclosure, a shape, form, structure, location, etc. of the disclosure are not limited unless essential for implementation of the disclosure.

In the description of the disclosure, a connection between elements includes an electrical connection or a direct or indirect physical connection. Elements which require electrical connection therebetween are described as being electrically connected. However, when it is obvious that elements are electrically connected by considering functions and effects of the elements, the term "connection" means an electrical connection.

An aspect of one or more exemplary embodiments is to provide a printed circuit board (PCB) which allows stable voltage supply to an integrated circuit (IC) installed on the PCB by reducing the amount of voltage drop in a power plane of the PCB.

Another aspect of one or more exemplary embodiments is to provide a PCB in which noise generated in a power plane of the PCB is effectively removed so that a voltage supplied to an IC installed on the PCB has a stable value.

Another aspect of one or more exemplary embodiments is to provide a method of preventing an increase in thickness when realizing a PCB for achieving the above objectives.

Another aspect of one or more exemplary embodiments is to provide an electronic apparatus which stably operates by including such a PCB.

Figure 4:
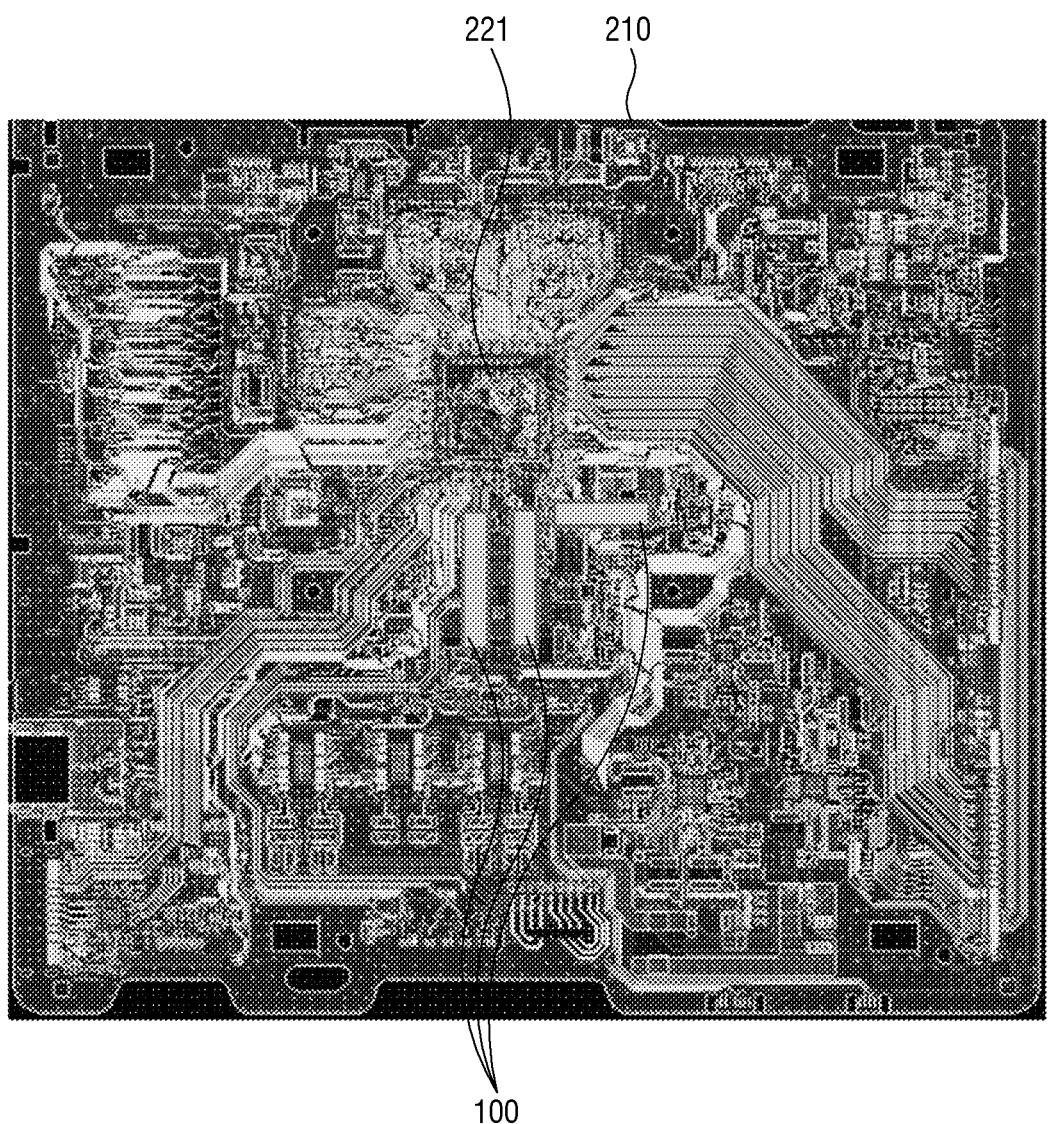
FIG. 4 is a diagram showing a PCB of the disclosure in which an auxiliary power supply is installed.
Figure 5:
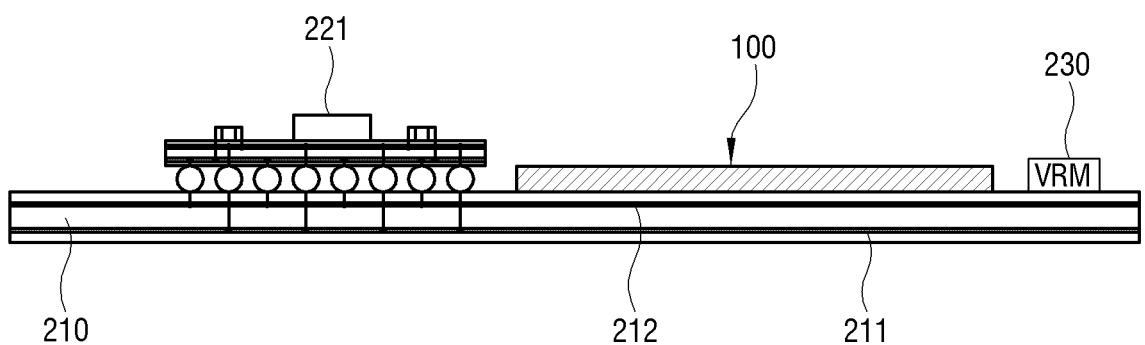
FIG. 5 is a schematic cross-sectional view of FIG. 4.

FIG. 4 is a diagram showing a PCB of the disclosure in which an auxiliary power supply is installed, and FIG. 5 is a schematic cross-sectional view of FIG. 4.

On a PCB 210, an integrated circuit (IC) 221, various electronic apparatuses, and a circuit pattern are provided. Also, a virtual resource module (VRM) 230 which is a power supply is provided on a board plane of the PCB 210. The VRM 230 serves as a regulator which regulates a voltage supplied from an external power source (not shown) connected to the PCB 210. Electrical power from the external power source is regulated by the VRM 230 and then supplied to the IC 221 through a power plane 211.

The power plane 211 and a ground plane 212 are provided in the PCB 210. The power plane 211 constitutes a main power supply path of the electrical power which is supplied from the VRM 230 to the IC 221, and the ground plane 212 constitutes a ground path for the power plane 211. A PCB generally includes two or more layers of planes in a board plane thereof, and a PCB includes four, six, or eight layers of planes as necessary. Some of the planes are used as the power plane 211 and the ground plane 212, and some other planes are used as signal planes for transferring a signal. In some cases, a certain plane is used as both a power plane and a signal plane or both a ground plane and a signal plane. Meanwhile, in the disclosure, the term "plane" is used for the power plane 211 and the ground plane 212, but "plane" is only a term generally used for each part of the PCB 210. The term does not limit the power plane 211 and the ground plane 212 to a flat board shape, and the term in the claims should be interpreted in the same way. For example, the power plane 211 and the ground plane 212 may be formed in a bar shape or a shape horizontally bent in the board plane of the PCB 210.

Figure 1:
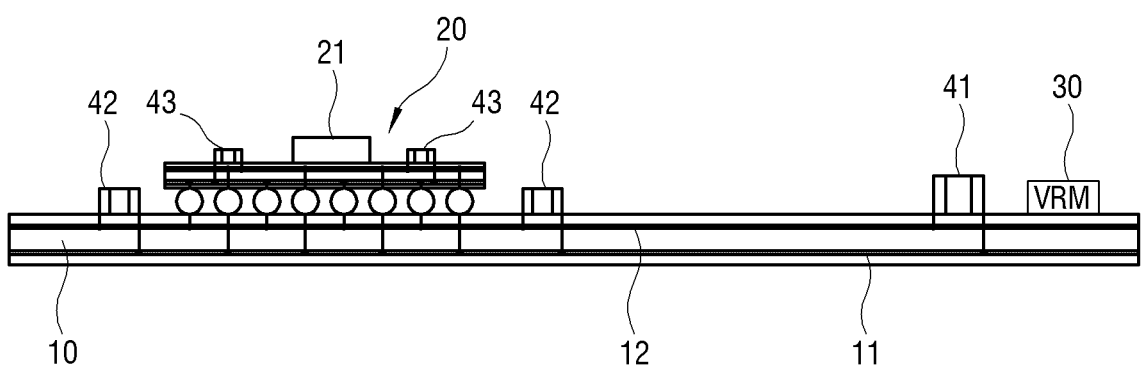
FIG. 1 is a diagram schematically showing a configuration of a general printed circuit board (PCB)
Figure 2:
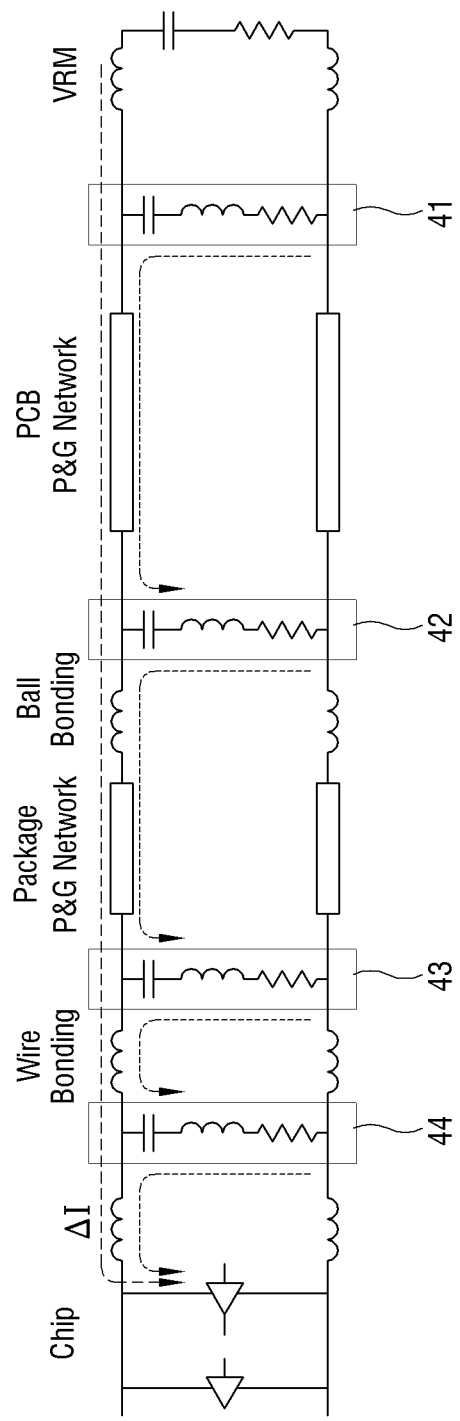
FIG. 2 is a schematic circuit diagram of FIG. 1.
Figure 3:
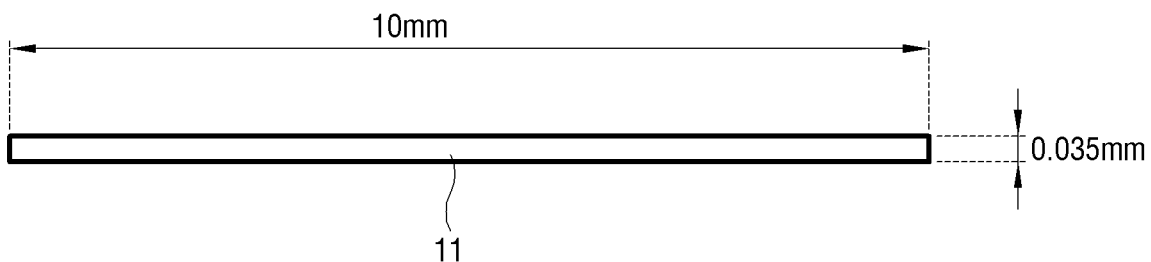
FIG. 3 is a cross-sectional view of a power plane of FIG. 1.

Although not shown in the drawings, the PCB 210 and the IC 221 of the disclosure include the capacitor elements 41, 42, 43, and 44 like the conventional PCB 10 shown in FIG. 1.

Auxiliary power supplies 100 are installed on the PCB 210. The auxiliary power supplies 100 have a long bar shape overall, and each auxiliary power supply 100 electrically connects the VRM 230 to the IC 221.

The auxiliary power supply 100 is mounted on an upper surface of the PCB 210 by surface mount technology (SMT). FIG. 4 shows an embodiment of the PCB 210 including three VRMs 230, and three auxiliary power supplies 100 are provided.

Figure 6:
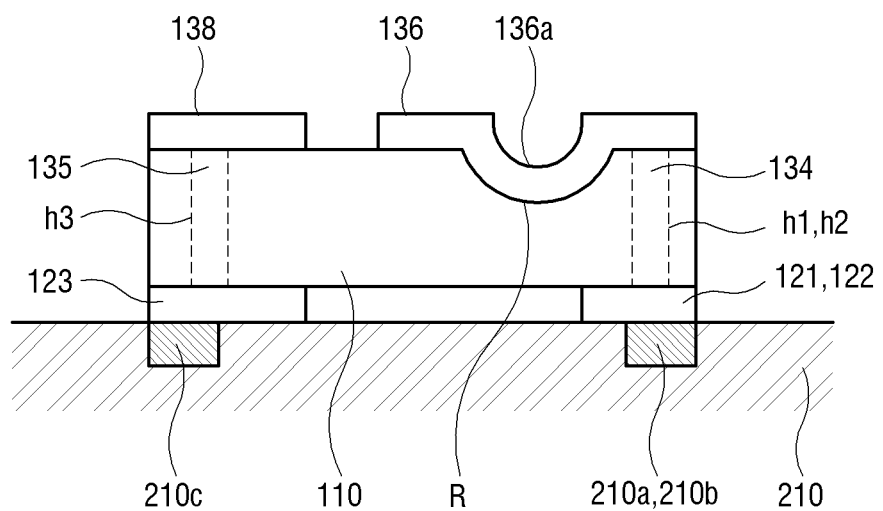
FIGS. 6 to 8 are lateral views of the auxiliary power supply of FIG. 5.
Figure 7:
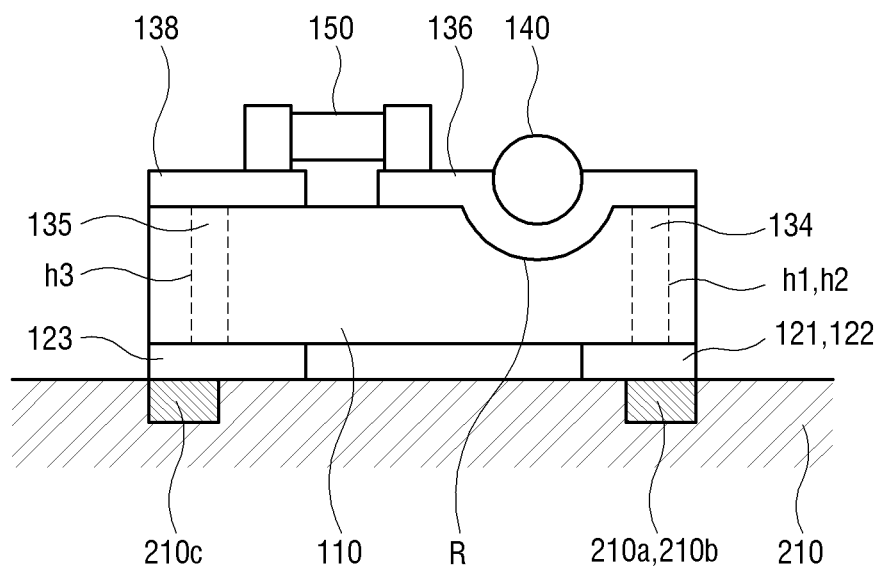
Figure 8:
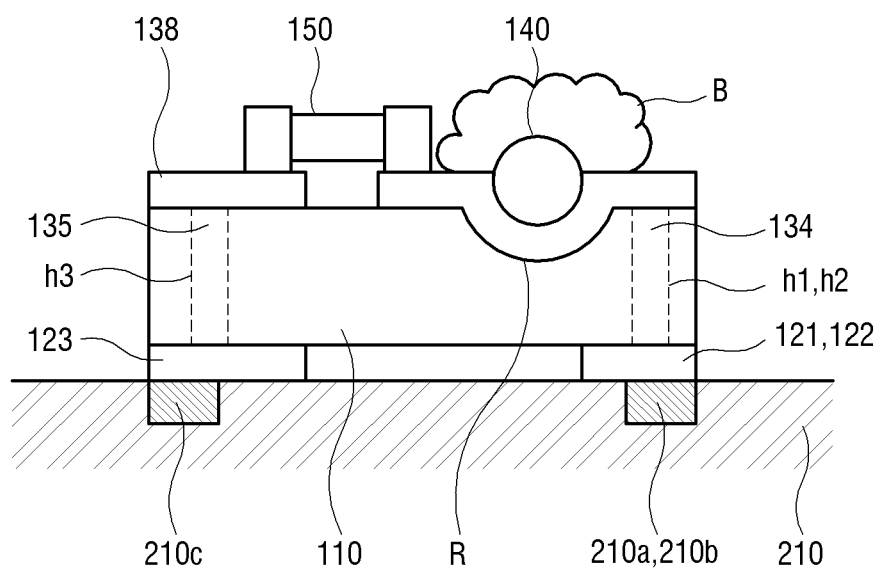
Figure 9:
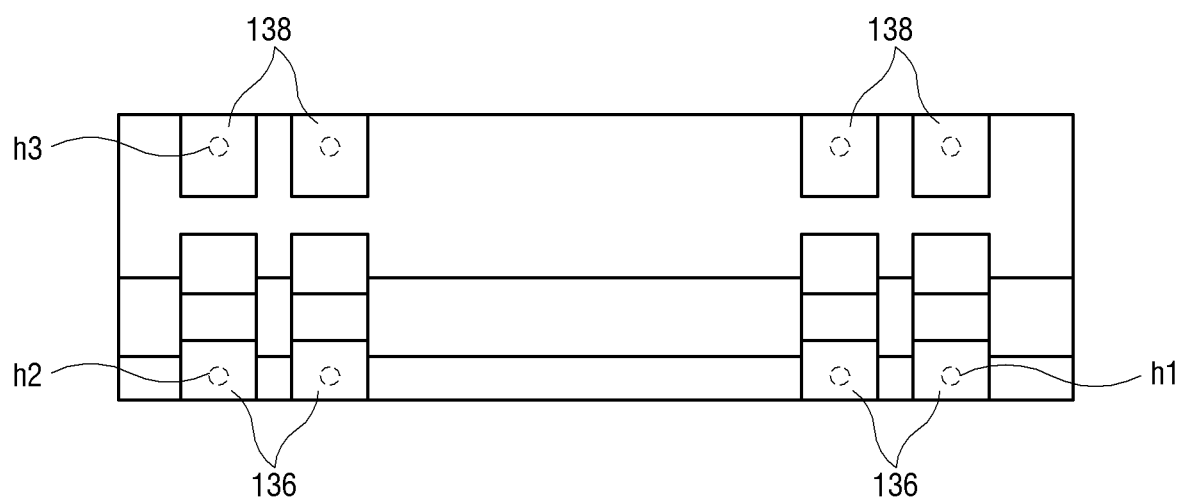
FIGS. 9 to 11 are top-down views of FIGS. 6 to 8.
Figure 10:
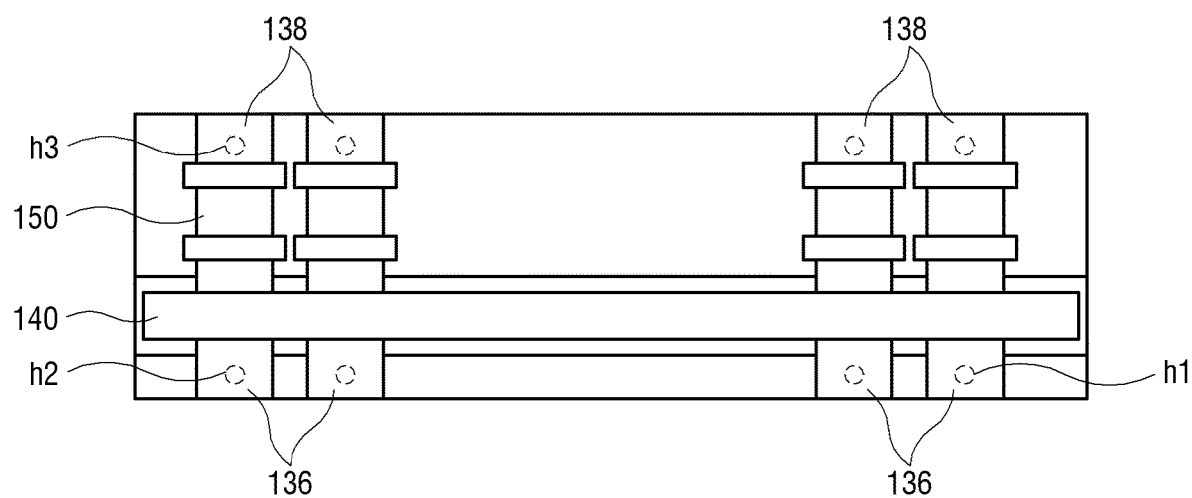
Figure 11:
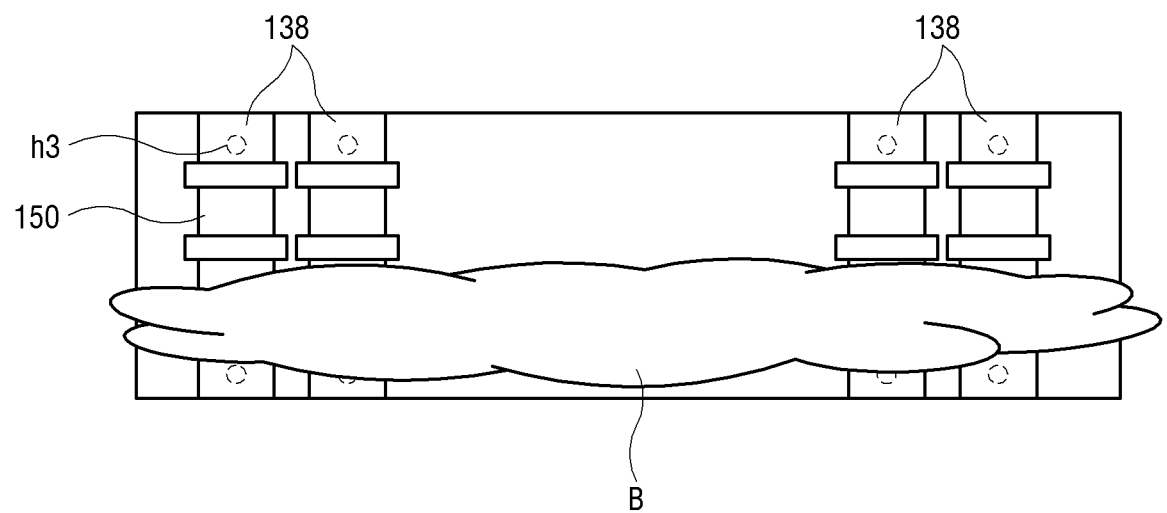

FIGS. 6 to 8 are lateral views of the auxiliary power supply of FIG. 5, and FIGS. 9 to 11 are top-down views FIGS. 6 to 8. A final complete configuration of the auxiliary power supplies 100 is shown in FIGS. 8 and 11, but for convenience of description and illustration, FIGS. 6 and 7 and FIGS. 9 and 10 respectively corresponding thereto show the final configuration of FIGS. 8 and 11 excluding some elements of the final configuration of FIGS. 8 and 11.

The auxiliary power supplies 100 of the disclosure include a body 110, a conductive member 140, and capacitor elements 150.

The body 110 is formed of an insulating material and formed in a long bar shape having a rectangular vertical cross section. A shape, for example, a width, a length, and a thickness of the body 110 may vary as necessary. To ensure an installation space of the body 110, in the PCB 210, a region in which the body 110 is installed may be an empty region in which the circuit pattern is not formed. However, the body 110 is formed of the insulating material, and thus the region in which the body 110 is installed is not necessarily an empty region.

The conductive member 140 installed on an upper surface of the body 110. One end of the conductive member 140 is connected to the VRM 230 installed on the PCB 210, and the other end is connected to the IC 221. Therefore, the conductive member 140 provides an additional path for power supply from the VRM 230 to the IC 221, that is, a power supply path which is additional to the main power supply path constituted of the power plane 211. Although the conductive member 140 is not limited to a specific shape and form, as a preferred example, the conductive member 140 is in the form of a wire having a circular cross section.

The capacitor elements 150 are installed beside the conductive member 140 on the upper surface of the body 110. One ends of the capacitor elements 150 are connected to the conductive member 140. Because the conductive member 140 provides the additional power supply path between the VRM 230 and the IC 221 installed on the PCB 210, the ends of the capacitor elements 150 are connected to the power supply path as a result. The other ends of the capacitor elements 150 are connected to the ground plane 212 in the PCB 210. Therefore, the capacitor elements 150 function to divert noise components, which are included in the power supplied from the VRM 230 to the IC 221, to the ground plane 12.

A bottom surface of the body 110 is a first surface which is in contact with the PCB 210, and an upper surface thereof is a second surface which is a backside of the first surface. First pads 121 and second pads 122 are provided in the first surface of the body 110. The first pads 121 and the second pads 122 are provided at locations corresponding to the end and the other end of the conductive member 140 in the first surface of the body 110, respectively.

On the board plane of the PCB 210, first contact points 210a and second contact points 210b respectively corresponding to the first pads 121 and the second pads 122 are provided. The first contact points 210a are on the side of the VRM 230 on the PCB 210, and the second contact points 210b are on the side of the IC 221 on the PCB 210. In other words, the first contact points 210a and the second contact points 210b are connected to the power plane 211. The first contact points 210a are connected to points adjacent to the VRM 230, and the second contact points 210b are connected to points adjacent to the IC 221. When the body 110 is mounted on the board plane, the first pads 121 and the second pads 122 are in contact with the first contact points 210a and the second contact points 210b, respectively. Accordingly, the first pads 121 and the second pads 122 are electrically connected to the VRM 230 and the IC 221, respectively.

The conductive member 140 is disposed on the second surface which is the upper surface of the body 110. An accommodation groove R in which the conductive member 140 is accommodated is formed in the body 110. The accommodation groove R has a semicircular cross section to fit to the circular cross section of the conductive member 140. Also, the accommodation groove R is formed in a long groove shape to fit to the shape of the conductive member 140 in a longitudinal direction of the conductive member 140. Accordingly, the conductive member 140 is accommodated in the accommodation groove R with about half of the conductive member 140 put therein. An insulating bond B is applied onto the conductive member 140 put in the accommodation groove R so that a short circuit with other parts on the PCB 210 may be prevented.

First conductive pads 136 are formed on the upper surface of the body 110. The first conductive pads 136 are in the form of a thin film which occupies a partial region of the upper surface of the body 110. The first conductive pads 136 include internal conductive pads 136a formed on an internal surface of the accommodation groove R of the body 110. Consequently, an external surface of the conductive member 140 accommodated in the accommodation groove R is in contact with the internal conductive pads 136a and electrically connected thereto.

Via holes h1 and h2 are formed at locations which correspond to the first pads 121 and the second pads 122, respectively. The via holes h1 and h2 are filled with connection units 134, which connect each of the first pads 121 and the second pads 122 to the internal conductive pads 136a. The connection units 134 are formed of a conductive material, and preferably, the first pads 121, the second pads 122, and the connection units 134 are formed of the same material. Accordingly, the first pads 121 and the second pads 122 are electrically connected to the both ends of the conductive member 140 through the connection units 134 and the internal conductive pads 136a.

Meanwhile, third pads 123 are provided in the first surface of the body 110. The third pads 123 are provided in the first surface (bottom surface) of the body 110 and are preferably provided on the opposite side of the first pads 121 and the second pads 122 as shown in FIGS. 7 and 8.

Third contact points 210c corresponding to the third pads 123 are provided on the board plane of the PCB 210. The third contact points 210c are contact points connected to the ground plane 212. In other words, the third contact points 210c are connected to the ground plane 212 in the board plane of the PCB 210. When the body 110 is mounted on the board plane, the third pads 123 are in contact with the third contact points 210c. Accordingly, the third pads 123 are electrically connected to the ground plane 212.

The capacitor elements 150 are disposed on the second surface which is the upper surface of the body 110, specifically, beside the conductive member 140. Second conductive pads 138 are formed on the upper surface of the body 110. The second conductive pads 138 are in the form of a thin film which occupies a partial region of the upper surface of the body 110. The second conductive pads 138 are configured to constitute one layer together with the first conductive pads 136 and are disconnected from the first conductive pads 136. For example, the upper surface of the body 110 is coated with a copper thin film, and the copper thin film is patterned so that the first conductive pads 136 and the second conductive pads 138 may be formed. The capacitor elements 150 are installed to connect the first conductive pads 136 and the second conductive pads 138.

Via holes h3 are formed at locations corresponding to the third pads 123 in the body 110. The via holes h3 are filled with connection units 135, which separately connect the third pads 123 to the second conductive pads 138. The connection units 135 are formed of a conductive material, and preferably, the second conductive pads 138, the third pads 123, and the connection units 135 are formed of the same material. Accordingly, the third pads 123 are electrically connected to the ends of the capacitor elements 150 through the connection units 135 and the second conductive pads 138.

Operation of the PCB having the above described configuration according to the disclosure will be described below.

When the general PCB 210 having the configuration shown in FIG. 1 is equipped with the auxiliary power supply 100, an additional power supply path of the auxiliary power supply 100 is formed in addition to the power plane 211 of the PCB 210. The power supply path is formed of the conductive member 140, which functions to reduce a resistance value of the overall power supply path. Consequently, a voltage drop in the power supply path is reduced. Also, an inductance of the power supply path is reduced, and noise is reduced accordingly.

In addition, the capacitor elements 150 of the auxiliary power supply 150 serve as additional bypass capacitors in the power supply path. Consequently, a noise removal function is performed by the capacitor elements 150 as well as other capacitor elements provided in the PCB 10, and thus noise of power supplied to the IC 221 is remarkably removed.

Due to the remarkable noise reduction, the number of planes may be reduced in the PCB 210 of the disclosure. According to the conventional art, in order to reduce noise, several planes among many planes should be exclusively used for power supply, or a plane for signal transmission should be also used as a power plane. In this case, it is better for the PCB 210 to have a large number of planes, and thus the PCB 210 should have, for example, four, six, or eight layers of planes. Also, when there are several power planes, a VRM 230 should be separately provided for each of the power planes.

Figure 12:
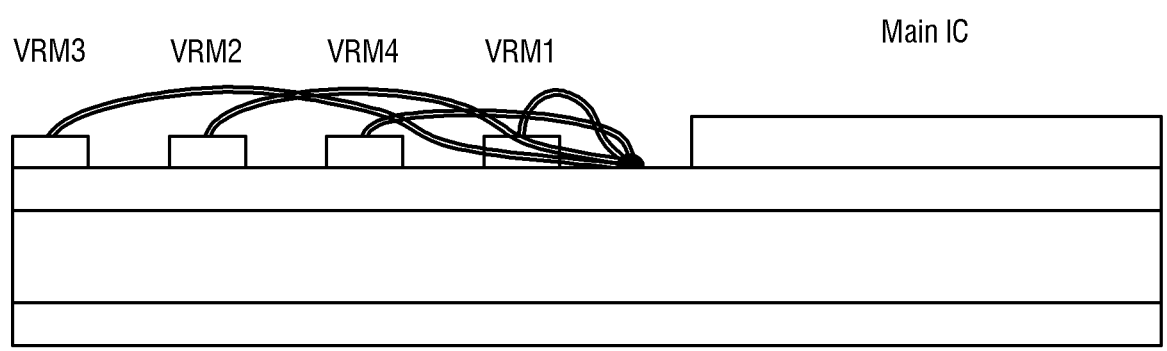
FIG. 12 is a diagram schematically showing an example of a PCB for implementing the disclosure.

However, according to the disclosure, it is possible to sufficiently reduce noise without using a plurality of planes as power planes as described above. Therefore, a PCB which conventionally requires eight layers of planes may be replaced by a PCB having four layers, or a PCB which requires four layers of planes may be replaced by a PCB having two layers. Consequently, it is possible to further reduce size of an electronic apparatus, especially, a small electronic apparatus. FIG. 12 is a diagram schematically showing a PCB to which an auxiliary power supply of the disclosure is applied to illustrate a reduction in the number of layers. FIG. 12 illustrates a PCB having four VRMs. For example, even when four power planes are used or a driving power source used in an IC requires four different voltages, four VRMs may be necessary as shown in FIG. 12. In this case, the auxiliary power supply 100 of the disclosure may be used to connect each VRM directly to the IC 221. Therefore, even when four power planes are not used, the auxiliary power supply 100 may be used to supply power with reduced noise. Consequently, the number of required plane layers of a PCB is reduced, and thus it is possible to reduce size of a PCB and an electronic apparatus employing the PCB.

Also, the auxiliary power supply 100 is mounted on the PCB 210 by SMT. Because the auxiliary power supply 100 is installed on the upper surface of the PCB 210 rather than a lower surface, thickness of the PCB 210 is not additionally increased.

Further, according to the conventional PCB 10, when a plurality of planes are used as power planes, noise may be caused by crosstalk between the power planes. However, according to the disclosure, the auxiliary power supply 100 is mounted on the PCB 210. Consequently, there is long distance between the power plane 211 and the conductive member 140, and thus very little noise is caused by crosstalk.

Modified examples of the disclosure will be described below.

Figure 13:
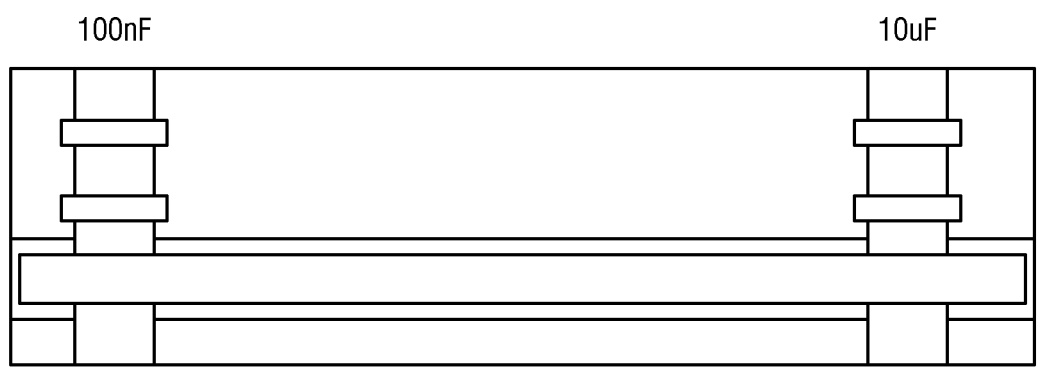
FIGS. 13 to 15 are diagrams showing modified examples for coping with different amounts of noise.
Figure 14:
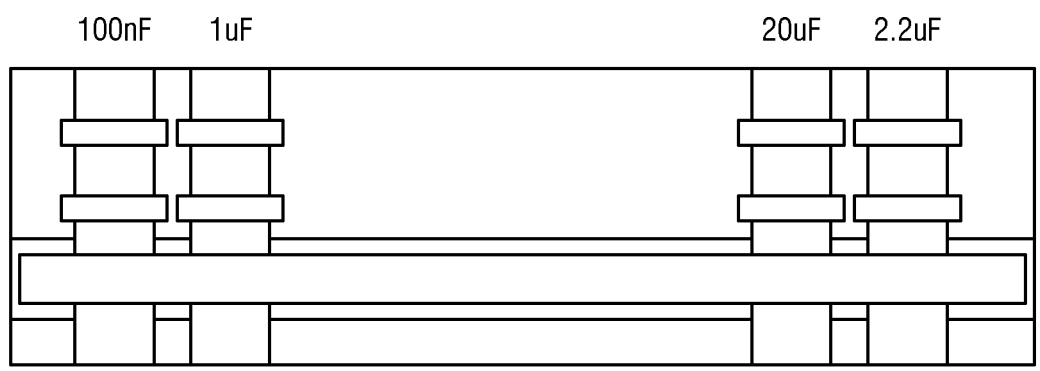
Figure 15:
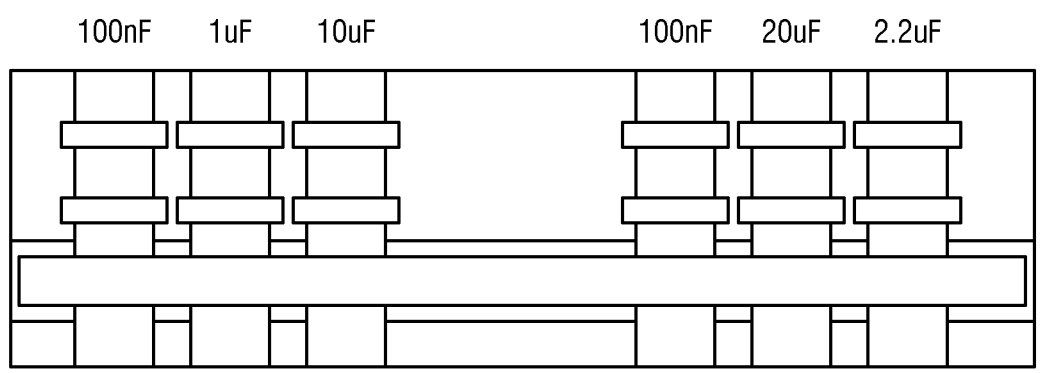

FIGS. 13 to 15 are diagrams showing modified examples for coping with different amounts of noise. FIG. 13 shows an example in which two capacitor elements are provided, FIG. 14 shows an example in which four capacitor elements are provided, and FIG. 15 shows an example in which six capacitor elements are provided. To improve noise removal effects, capacities of capacitor elements may be increased, or the number of capacitor elements may be increased. Therefore, when noise removal is required further, a larger number of capacitor elements may be provided. In this case, the capacitor elements are disposed in parallel to increase capacitance. A capacity of each capacitor element may be experimentally determined to be an optimized capacity as required by a PCB.

Figure 16:
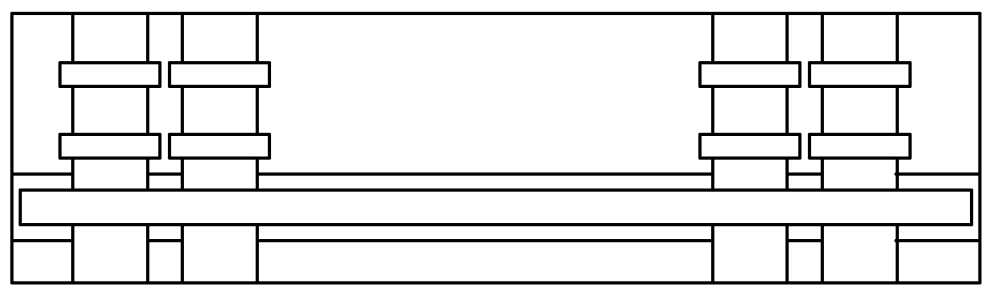
FIGS. 16 to 18 are diagrams showing modified examples for coping with different amounts of voltage drops.
Figure 17:
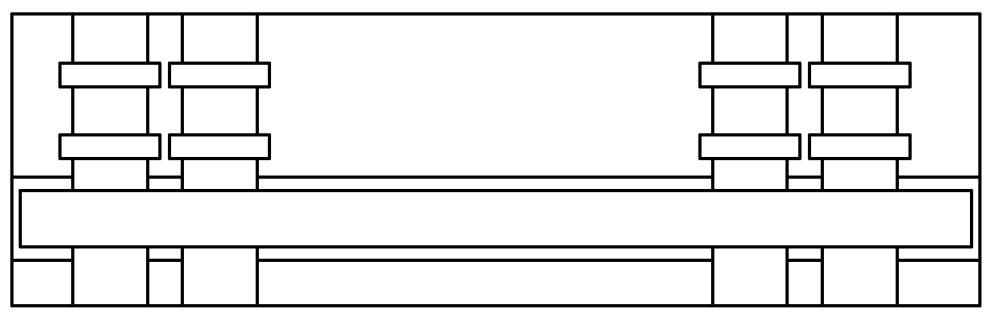
Figure 18:
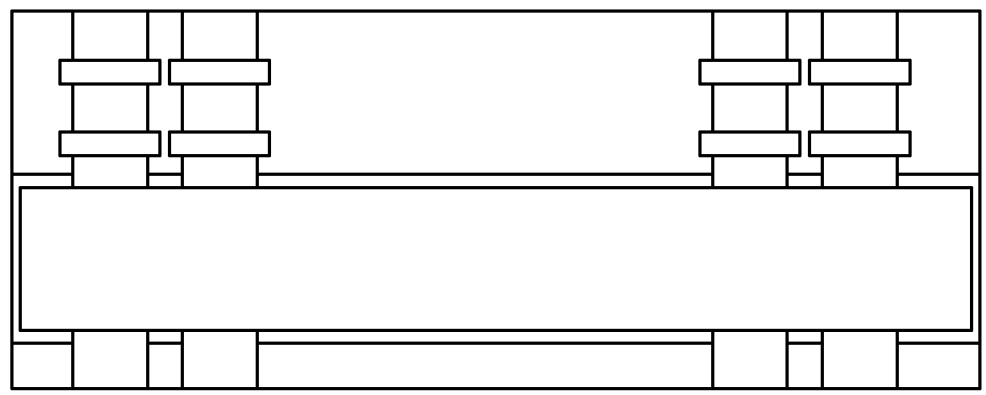

FIGS. 16 to 18 are diagrams showing modified examples for coping with different amounts of voltage drops. FIG. 16 shows an example in which a conductive member has a small cross-sectional area, FIG. 17 shows an example in which a conductive member has a larger cross-sectional area than the conductive member of FIG. 16, and FIG. 18 shows an example in which a conductive member has a larger cross-sectional area than the conductive member of FIG. 17. In order to remarkably reduce the amount of a voltage drop, it is preferable to increase a cross-sectional area of a conductive member. Therefore, when a greater voltage drop reduction effect is required, a conductive member having a greater cross-sectional area is selected. FIGS. 16 to 18 show examples in which width of a conductive member is increased so that a cross-sectional area may be increased, but it is possible to increase thickness of a conductive member or increase both width and thickness of a conductive member so as to increase a cross-sectional area. As an example, when both thickness and width of a conductive member are doubled, a cross-sectional area of the conductive member is quadrupled so that a resistance value of the conductive member is reduced to a quarter. A cross-sectional area of a conductive member is optimized by considering a reduction in voltage drop required by the PCB 210 and size of a space in which the auxiliary power supply 100 is installed on the PCB 210.

Figure 19:
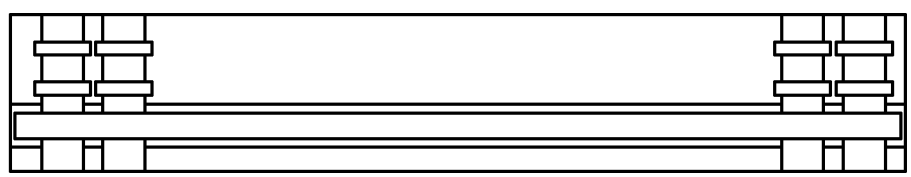
FIGS. 19 and 20 are diagrams showing modified examples having different lengths.
Figure 20:
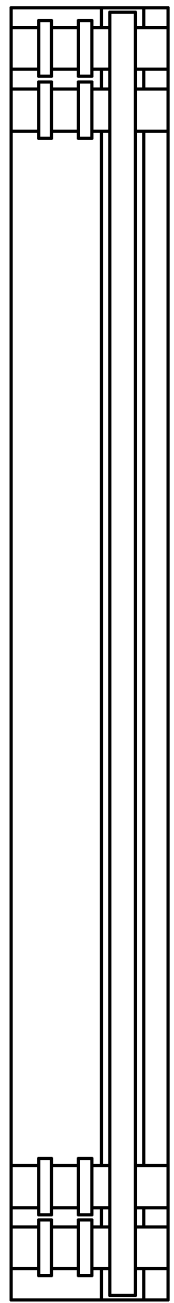

FIGS. 19 and 20 are diagrams showing modified examples having different lengths. A body and a conductive member may vary in length. In this case, for example, when several VRMs are provided in a PCB, an auxiliary power supply of which length varies depending on distance between each VRM and an IC may be selected and used. When the length of the auxiliary power supply is increased, a resistance value of the conductive member is increased in proportion to the length. Therefore, when a long conductive member is used, a resistance value is increased, and a voltage drop reduction effect is reduced. In this case, it is possible to satisfy a required degree of voltage drop reduction by increasing a cross-sectional area of the conductive member.

Meanwhile, in the above-described embodiment of the disclosure, an example in which the conductive member 140 and the capacitor elements 150 are provided together with the body 110 has been described. However, the auxiliary power supply 100 may be configured to only include either of the conductive member 140 or the capacitor elements 150. For example, when it is unnecessary to reduce the amount of a voltage drop, the conductive member 140 may be omitted, and only the capacitor elements 150 may be included.

According to the disclosure, the amount of a voltage drop is reduced in a power plane of a PCB. Therefore, it is possible to supply a stable voltage to an IC installed on a PCB and reduce noise generation. Also, because an auxiliary power supply is mounted on the PCB by SMT, a thickness of the PCB is not increased.

In addition, according to the disclosure, an electronic apparatus including the PCB having such a structure is provided.

Although exemplary embodiments of the disclosure have been shown and described, the disclosure is not limited to the above-described specific embodiments. Various modifications and variations may be made by those skilled in the art without departing from the spirit of the disclosure as defined by the claims. These modifications and variations should not be understood separately from the technical spirit and prospect of the disclosure.

What is claimed is:

1. A printed circuit board comprising:
    an integrated circuit (IC) mountable on a board plane;
    a power supply provided on the board plane and connectable to an external power source to supply power to the IC;
    a power plane, provided on the board plane, configured to provide a main path to supply the power from the power supply that is connected to the external power source to the IC;
    a ground plane, provided on the board plane, configured to provide a ground path corresponding to the power supplied by the power plane;
    a body mountable on the board plane by surface mount technology (SMT) and formed of an insulating material; and
    a conductive member, having a portion accommodated into an upper surface of the body, and having one end connected to one point of the power plane adjacent to the power supply and another end connected to another point of the power plane adjacent to the IC to provide an additional power supply path in parallel with the main path provided by the power plane.

2. The printed circuit board of claim 1, further comprising:
    a first pad and a second pad disposed on a lower surface of the body which is in contact with the board plane, and electrically connected to each of the one end and the other end of the conductive member; and a first contact point and a second contact point provided on the board plane, respectively in contact with the first pad and the second pad while the body is mounted on the board plane, and respectively connected to the power supply and the IC.

3. The printed circuit board of claim 2, wherein the lower surface of the body which is in contact with the board plane is a first surface and the conductive member is disposed on a second surface of the body which is the upper surface, and
via holes, for electrically connecting each of the first pad and the second pad to the conductive member, are formed in the body.

4. The printed circuit board of claim 3, further comprising:
conductive pads provided in the second surface of the body and electrically connected to the first pad and the second pad through the via holes,
wherein the conductive member is disposed on the conductive pads.

5. The printed circuit board of claim 4, wherein the body further comprises:
an accommodation groove in which the conductive member is fitted formed in the body, and
the conductive pads are provided on an internal surface of the accommodation groove.

6. The printed circuit board of claim 1, further comprising:
a capacitor element disposed on the body and having one end connected to the conductive member and another end connected to the ground plane to divert noise components, which are included in the power supplied from the power supply to the IC, to the ground plane.

7. The printed circuit board of claim 6, further comprising:
a pad disposed on a lower surface of the body which is in contact with the board plane, and electrically connected to the capacitor element; and
a contact point provided on the board plane, in contact with the pad while the body is mounted on the board plane, and connected to the ground plane.

8. The printed circuit board of claim 7, wherein the lower surface of the body which is in contact with the board plane is a first surface and the capacitor element is disposed on a second surface of the body which is the upper surface, and
a via hole, for electrically connecting the pad to the capacitor element, is formed in the body.

9. The printed circuit board of claim 6, wherein a plurality of capacitor elements identical to the capacitor element are disposed in parallel.

10. A printed circuit board comprising:
an integrated circuit (IC) mountable on a board plane;
a power supply provided on the board plane and connectable to an external power source to supply power to the IC;
a power plane, provided on the board plane, configured to provide a main path to supply the power from the power supply that is connected to the external power source to the IC;
a ground plane, provided on the board plane, configured to provide a ground path corresponding to the power supplied by the power plane;
a body mountable on the board plane by surface mount technology (SMT) and formed of an insulating material; and
a capacitor element having a portion accommodated into an upper surface of the body, and having one end connected to one point of the power plane adjacent to a power supply path between the power supply and the IC and another end connected to another point of the power plane adjacent to the ground plane to divert noise components, which are included in the power supplied from the power supply to the IC, to the main path provided by the ground plane.

11. The printed circuit board of claim 10, further comprising:
a pad disposed on a lower surface of the body which is in contact with the board plane, and electrically connected to the capacitor element; and
a contact point, provided on the board plane, in contact with the pad while the body is mounted on the board plane, and connected to the ground plane.

12. The printed circuit board of claim 11, wherein the lower surface of the body which is in contact with the board plane is a first surface and the capacitor element is disposed on a second surface of the body which is the upper surface, and
a via hole for electrically connecting the pad to the capacitor element is formed in the body.

13. The printed circuit board of claim 10, wherein a plurality of capacitor elements identical to the capacitor element are disposed in parallel.

14. An electronic apparatus comprising a printed circuit board, wherein the printed circuit board comprises:
an integrated circuit (IC) mountable on a board plane;
a power supply provided on the board plane and connectable to an external power source to supply necessary power to the IC;
a power plane, provided on the board plane, configured to provide a main path to supply the power from the power supply that is connected to the external power source to the IC;
a ground plane, provided on the board plane, configured to provide a ground path corresponding to the power supplied by the power plane;
a body mountable on the board plane by surface mount technology (SMT) and formed of an insulating material; and
a conductive member having a portion accommodated into an upper surface of the body, and having one end connected to one point of the power plane adjacent to the power supply and another end connected to another point of the power plane adjacent to the IC to provide an additional power supply path in parallel with the main path provided by power plane.

15. The electronic apparatus of claim 14, wherein the printed circuit board further comprises:
a capacitor element disposed on the body and having one end connected to the conductive member and another end connected to the ground plane to divert noise components, which are included in the power supplied from the power supply to the IC, to the ground plane.

16. An electronic apparatus including a printed circuit board, wherein the printed circuit board comprises:
an integrated circuit (IC) mountable on a board plane;
a power supply provided on the board plane and connectable to an external power source to supply necessary power to the IC;
a power plane, provided on the board plane, configured to provide a main path to supply the power from the power supply that is connected to the external power source to the IC;
a ground plane, provided on the board plane, configured to provide a ground path corresponding to the power supplied by the power plane;

a body mountable on the board plane by surface mount technology (SMT) and formed of an insulating material; and a capacitor element having a portion accommodated into an upper surface of the body, and having one end connected to one point of the power plane adjacent to the power supply and the IC and another end connected to another point of the power plane adjacent to the ground plane to divert noise components, which are included in the power supplied from the power supply to the IC, to the main path provided by the ground plane.

\* \* \* \* \*